(12) United States Patent
Kim et al.

(10) Patent No.: US 7,909,960 B2
(45) Date of Patent: Mar. 22, 2011

(54) APPARATUS AND METHODS TO REMOVE FILMS ON BEVEL EDGE AND BACKSIDE OF WAFER

(75) Inventors: Yunsang Kim, Monte Sereno, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 318 days.

(21) Appl. No.: 11/440,561

(22) Filed: May 24, 2006

(65) Prior Publication Data
US 2007/0068900 A1    Mar. 29, 2007

Related U.S. Application Data

(63) Continuation-in-part of application No. 11/237,327, filed on Sep. 27, 2005.

(51) Int. Cl.
*C23F 1/00* (2006.01)
*H01L 21/306* (2006.01)

(52) U.S. Cl. ................................... 156/345.3

(58) Field of Classification Search ............... 156/345.3
See application file for complete search history.

(56) References Cited

U.S. PATENT DOCUMENTS

| | | | |
|---|---|---|---|
| 5,273,588 A | 12/1993 | Foster | |
| 5,693,241 A | 12/1997 | Banks et al. | |
| 5,788,799 A | 8/1998 | Steger | |
| 5,961,772 A | 10/1999 | Selwyn | |
| 6,013,155 A | 1/2000 | McMillin et al. | |
| 6,153,044 A | 11/2000 | Klebanoff et al. | |
| 6,189,570 B1 | 2/2001 | Redemann et al. | |
| 6,364,957 B1 * | 4/2002 | Schneider et al. | 118/728 |
| 6,471,830 B1 | 10/2002 | Moslehi et al. | |
| 6,534,921 B1 | 3/2003 | Seo et al. | |
| 6,837,967 B1 * | 1/2005 | Berman et al. | 156/345.3 |

(Continued)

FOREIGN PATENT DOCUMENTS

JP    07-142449    *   6/1995

(Continued)

OTHER PUBLICATIONS

English translation of JP 07-142449, Masuda, Jun. 1995.*

(Continued)

*Primary Examiner* — Parviz Hassanzadeh
*Assistant Examiner* — Keath T Chen
(74) *Attorney, Agent, or Firm* — IP Strategy Group, P.C.

(57) ABSTRACT

Improved mechanisms of removal of etch byproducts, dielectric films and metal films near the substrate bevel edge, and etch byproducts on substrate backside and chamber interior is provided to avoid the accumulation of polymer byproduct and deposited films and to improve process yield. An exemplary plasma etch processing chamber configured to clean a bevel edge of a substrate is provided. The chamber includes a bottom edge electrode surrounding a substrate support in the plasma processing chamber, wherein the substrate support is configured to receive the substrate and the bottom edge electrode and the substrate support are electrically isolated from each other by a bottom dielectric ring. The chamber also includes a top edge electrode surrounding a gas distribution plate opposing the substrate support, wherein the top edge electrode and the gas distribution plate are electrically isolated from each other by a top dielectric ring, and the top edge electrode and the bottom edge electrode are configured to generate a cleaning plasma to clean the bevel edge of the substrate.

9 Claims, 11 Drawing Sheets

U.S. PATENT DOCUMENTS

| | | | |
|---|---|---|---|
| 2002/0142612 A1 | 10/2002 | Wu et al. | |
| 2003/0164142 A1 | 9/2003 | Koshimizu | |
| 2004/0108068 A1* | 6/2004 | Senzaki et al. | 156/345.43 |
| 2004/0238488 A1* | 12/2004 | Choi et al. | 216/58 |
| 2005/0173067 A1* | 8/2005 | Lim | 156/345.32 |
| 2005/0178505 A1* | 8/2005 | Kim | 156/345.47 |
| 2007/0068623 A1 | 3/2007 | Kim et al. | |

FOREIGN PATENT DOCUMENTS

| | | |
|---|---|---|
| JP | 2007/142449 | 6/1995 |
| JP | 7142449 | 6/1995 |
| JP | 8158072 | 6/1996 |
| KR | 2002/0080955 | 10/2002 |

OTHER PUBLICATIONS

"International Search Report", Issued in PCT Application No. PCT/US06/37492 Mailing Date: Jul. 9, 2008.

"Written Opinion", Issued in PCT Application No. PCT/US06/37492 Mailing Date: Jul. 9, 2008.

"International Preliminary Report on Patentability", Issued in PCT Application No. PCT/US2006/037492; Mailing Date: Oct. 16, 2008.

"International Search Report", Issued in PCT Application No. PCT/US2006/037648; Mailing Date: Apr. 3, 2007.

"Written Opinion". Issued in PCT Application No. PCT/US2006/037648; Mailing Date: Apr. 3, 2007.

"International Preliminary Report on Patentability", Issued in PCT Application No. PCT/US2006/037648; Mailing Date: Mar. 11, 2008.

"Final Office Action"; U.S. Appl. No. 11/237,327; Correspondence Date:Feb. 11, 2009.

"Non-Final Office Action"; U.S. Appl. No. 11/237,327; Correspondence Date: Oct. 9, 2008.

"Final Office Action"; U.S. Appl. No. 11/237,327; Correspondence Date: Apr. 1, 2008.

"Non-Final Office Action"; U.S. Appl. No. 11/237,327; Correspondence Date:Oct. 23, 2007.

"Australian Patent Office Written Opinion and Search Report"; For LMRX-P086SG; Application No. SG200802000-0; Ref No. SP-3661; Date of mailing: Dec. 23, 2008.

Davis, Warren "How does a Faraday Cage work? Or, Why can a satellite dish have holes in it?"; URL: http:www.physlink.com/Education/AskExperts/ae176.cfm; Total pp. 2.

Aldea, et al., "Generation of a Stable Atmospheric Glow in a DBD Configuration"; Eindhoven University of Technology; Dept. of Applied Physics, Eindhoven; The Netherlands; pp. 1-7.

Kunze, Kerstin "Miniaturized Discharges—Prospects and Limits for Quantitative analysis"; Dissertation; Zur Erlangung Doktorgrades der Naturwissenschaften des Fachbereichs der Universitat Dortmund; 2004; pp. 1-143.

Selwyn, et al., "Materials Processing using an Atmospheric-Pressure Plasma Jet"; Physics Division Progress Report 1999-2000: pp. 189-197.

Kogelschatz, U. "Fundamentals and Applications of Dielectric-Barrier Discharges"; ABB Corporate Research Ltd.; Switzerland; 5/200; pp. 1-7.

Babayan, et al., "Deposition of silicon dioxide films with a non-equilibrium atmospheric-pressure plasma jet"; 2001; Institute of Physics Publishing Ltd; pp. 573-578.

Ichiki, et al., "An atmospheric-pressure microplasma jet source for the optical emission spectroscopic analysis of liquid sample"; 2003; Institute of Physics Publishing; pp. S16-S20.

Tepper, et al., "Pulsed uniform barrier discharges at atmospheric pressure"; Hakone VI international Symposium on High Pressure, Low Temperature Plasma Chemistry; Cork, Ireland; Aug. 31, 2002; pp. 1-5.

Fong, HP "Electroless Cu Deposition Process on TiN for ULSI interconnect fabrication via Pd/Sn colloid activation"; URL: http://www.findarticles.com/p/articles/mi_qa3776/is_200301/ai_n9178017/print; Aug. 22, 2005; pp. 1-4.

Sievenpiper, et al., "3D Wire Mesh Photonic Crystals"; Oct. 30, 1995; The American Physical Society vol. 76, No. 14; pp. 2480-2483.

"Non Final Office Action", U.S. Appl. No. 11/237,327, Mailing Date:Jun. 16, 2009.

"Final Office Action" U.S. Appl. No. 11/237,327, Mailing Date:Sep. 21, 2009.

"Non Final Office Action", U.S. Appl. No. 11/237,327, Mailing Date: Feb. 9, 2010.

"First Office Action", Issued in CN Application No. 200680035882.9, Mailing Date: Jun. 19, 2009.

"Final Office Action", U.S. Appl. No. 11/237,327; Correspondence Date: Apr. 14, 2010.

* cited by examiner

APPARATUS AND METHODS TO REMOVE FILMS ON BEVEL EDGE AND BACKSIDE OF WAFER

CROSS REFERENCE TO RELATED APPLICATION

This application is a continuation-in-part of U.S. patent application Ser. No. 11/237,327 filed on Sep. 27, 2005, and titled "Apparatus For The Removal Of A Set Of Byproducts From A Substrate Edge And Methods Therefor." The disclosure of this parent application is incorporated herein by reference in its entirety for all purposes.

BACKGROUND

The present invention relates in general to substrate manufacturing technologies and in particular to apparatus and methods for the removal etch byproducts from a bevel edge and a backside of a substrate.

In the processing of a substrate, e.g., a semiconductor substrate (or wafer) or a glass panel such as one used in flat panel display manufacturing, plasma is often employed. During substrate processing, the substrate (or wafer) is divided into a plurality of dies, or rectangular areas. Each of the plurality of dies will become an integrated circuit. The substrate is then processed in a series of steps in which materials are selectively removed (or etched) and deposited. Control of the transistor gate critical dimension (CD) on the order of a few nanometers is a top priority, as each nanometer deviation from the target gate length may translate directly into the operational speed and/or operability of these devices.

Typically, a substrate is coated with a thin film of hardened emulsion (such as a photoresist mask) prior to etching. Areas of the hardened emulsion are then selectively removed, causing parts of the underlying layer to become exposed. The substrate is then placed on a substrate support structure in a plasma processing chamber. An appropriate set of plasma gases is then introduced into the chamber and a plasma is generated to etch exposed areas of the substrate.

During an etch process, etch byproducts, for example polymers composed of Carbon (C), Oxygen (O), Nitrogen (N), Fluorine (F), etc., are often formed on the top and the bottom surfaces near a substrate edge (or bevel edge). Etch plasma density is normally lower near the edge of the substrate, which results in accumulation of polymer byproducts on the top and on the bottom surfaces of the substrate bevel edge. Typically, there are no dies present near the edge of the substrate, for example between about 5 mm to about 15 mm from the substrate edge. However, as successive byproduct polymer layers are deposited on the top and bottom surfaces of the bevel edge as a result of several different etch processes, organic bonds that are normally strong and adhesive will eventually weaken during subsequent processing steps. The polymer layers formed near the top and bottom surfaces of a substrate edge would then peel or flake off, often onto another substrate during substrate transport. For example, substrates are commonly moved in sets between plasma processing systems via substantially clean containers, often called cassettes. As a higher positioned substrate is repositioned in the container, byproduct particles (or flakes) may fall on a lower substrate where dies are present, potentially affecting device yield.

Etch byproducts can also be deposited on the backside of substrate support due to contamination or handling during the etching process. Since the substrate backside is not exposed to etching plasma, the byproduct polymer layer formed on the backside is not removed during subsequent etch processing steps. Therefore, the byproduct polymer layer can also accumulate on the substrate backside in a manner similar to the accumulation of polymer layer near the top and bottom surfaces of a substrate edge, and can result in particle problems. In addition, the interior of the process chamber, such as chamber walls, can also accumulate etch byproduct polymers, which needs to be removed periodically to avoid byproducts accumulation and chamber particle issues.

Dielectric films, such as SiN and $SiO_2$, and metal films, such as Al and Cu, can also be deposited on the bevel edge (including the top and bottom surfaces) and do not get removed during etching processes. These films can also accumulate and flake off during subsequent processing steps, thereby impacting device yield.

In view of the foregoing, there is a need for apparatus and methods that provide improved mechanisms of removal of etch byproducts, dielectric films and metal films near the substrate bevel edge, and etch byproducts on substrate backside and chamber interior to avoid accumulation of polymer byproducts and deposited films and to improve process yield.

SUMMARY

Broadly speaking, the embodiments fill the need by providing improved mechanisms of removal of etch byproducts, dielectric films and metal films near the substrate bevel edge, and etch byproducts on substrate backside and chamber interior to avoid the accumulation of polymer byproduct and deposited films and to improve process yield. It should be appreciated that the present invention can be implemented in numerous ways, including as a process, an apparatus, or a system. Several inventive embodiments of the present invention are described below.

In one embodiment, a plasma etch processing chamber configured to clean a bevel edge of a substrate is provided. The chamber includes a bottom edge electrode surrounding a substrate support in the plasma processing chamber, wherein the substrate support is configured to receive the substrate and the bottom edge electrode and the substrate support are electrically isolated from each other by a bottom dielectric ring. The chamber also includes a top edge electrode surrounding a gas distribution plate opposing the substrate support, wherein the top edge electrode and the gas distribution plate are electrically isolated from each other by a top dielectric ring, and the top edge electrode and the bottom edge electrode are configured to generate a cleaning plasma to clean the bevel edge of the substrate.

In another embodiment, a process chamber with a remote plasma source coupled to the substrate support to clean a chamber interior of the process chamber is provided. The chamber includes a substrate support in the process chamber and a remote plasma source coupled to the substrate support, wherein the remote plasma source supplies cleaning plasma to clean the chamber interior of the process chamber.

In another embodiment, an apparatus for cleaning a bevel edge of a substrate in a plasma etch processing chamber is provided. The apparatus includes a substrate support with a substrate disposed thereon and a cover plate that covers a center portion of a surface of the substrate and leaves the bevel edge of the substrate exposed during cleaning of the bevel edge. The apparatus also includes a cover plate support assembly that supports the cover plate over the substrate.

In yet another embodiment, a method of cleaning a bevel edge of a substrate in an etch processing chamber is provided. The method includes placing a substrate on a substrate support in a processing chamber and flowing a cleaning gas (or cleaning process gas) through a gas feed located near a center of a gas distribution plate, disposed at a distance from the substrate support. The method also includes generating a cleaning plasma near a bevel edge of the substrate to clean the bevel edge by powering a bottom edge electrode or a top edge electrode with a RF power source and grounding the edge electrode that is not powered by the RF power source, the bottom edge electrode surrounds the substrate support and the top edge electrode surrounds the gas distribution plate.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 1AA is an enlarged schematic diagram of region B in FIG. 1A.

DETAILED DESCRIPTION OF THE EXEMPLARY EMBODIMENTS

Several exemplary embodiments for improved mechanisms to remove etch byproducts, dielectric films and metal films near the substrate bevel edge, and etch byproducts on substrate backside and chamber interior to avoid polymer byproduct and film accumulation and to improve process yield. It will be apparent to those skilled in the art that the present invention may be practiced without some or all of the specific details set forth herein.

Figure 1A:
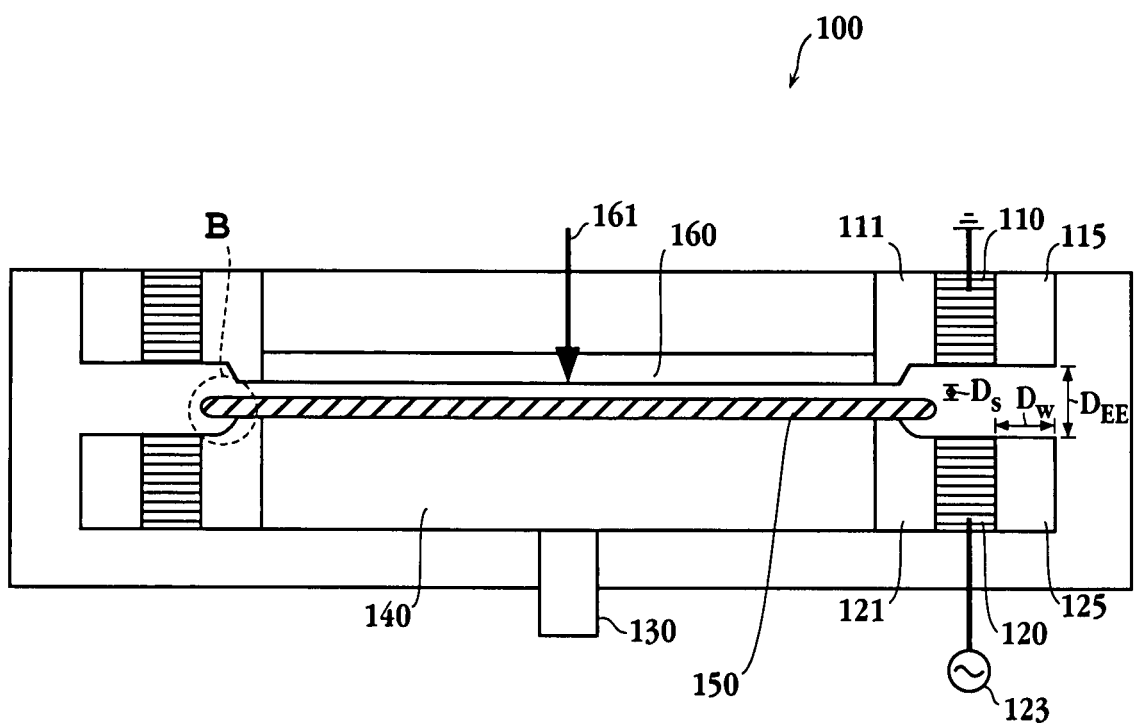
FIG. 1A shows a schematic diagram of one embodiment of a substrate etching system with a pair of top and bottom edge electrodes.
Figure 1A:
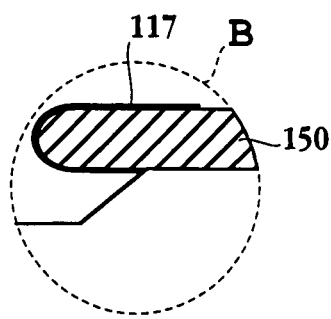

FIG. 1A shows an embodiment of an etch process chamber 100. Chamber 100 has a substrate support 140 with a substrate 150 on top. In one embodiment, the substrate support 140 is an electrostatic chuck, which is powered by a RF (radio frequency) power source (not shown). In another embodiment, the substrate support 140 is a regular electrode. The substrate support 140 can be DC (direct current) or RF biased. Opposing the substrate support 140 is a gas distribution plate 160 with a gas feed 161. The substrate support can also be RF powered, biased, or grounded. During etching of substrate 150, chamber 100 can be RF powered to generate capacitively coupled etch plasma or inductively coupled etch plasma. The substrate 150 has a bevel edge 117 that includes a top and a bottom surface of the edge of the substrate, as shown in region B of FIG. 1A and enlarged region B in FIG. 1AA. In FIG. 1AA, bevel edge 117 is highlighted as a bold solid line and curve.

Surrounding the edge of substrate support 140, there is a bottom edge electrode 120, made of conductive materials, such as aluminum (Al). Between the substrate support 140 and the bottom edge electrode 120, there is a bottom dielectric ring 121 electrically separating the substrate support 140 and the bottom edge electrode 120. In one embodiment, substrate 150 is not in contact with the bottom edge electrode 120. Beyond the bottom edge electrode 120, there is another bottom insulating ring 125, which extends the surface of the bottom edge electrode 120 facing substrate 150.

Surrounding the gas distribution plate 160, there is a top edge electrode 110, made of conductive materials, such as aluminum (Al). The top edge electrode 110 is electrically insulated from the gas distribution plate 160 by a top dielectric ring 111. Beyond the top edge electrode 110, there is top insulating ring 115, which extends the surface of the top edge electrode 110 facing substrate 150.

In one embodiment, the bottom edge electrode 120 is coupled to a RF power source 123 and the top edge electrode 110 is grounded. During a substrate bevel edge cleaning process, the RF power source 123 supplies RF power at a frequency between about 2 MHz to about 13 MHz and a power between about 100 watts to about 2000 watts to generate a cleaning plasma. During bevel edge cleaning the substrate support 140 and the gas distribution plate 160 are kept electrically floating. The cleaning plasma is configured to be confined by the top dielectric ring 111, top edge electrode 110, the top insulating ring 115, the bottom dielectric ring 121, the bottom edge electrode 120, and the bottom insulating ring. The cleaning gas(es) is supplied through the gas feed 161. In one embodiment, the gas feed is located near the center of the gas distribution plate 160. Alternatively, the cleaning gas(es) can also be supplied through gas feed(s) disposed in other parts of the process chamber 100.

To clean etch byproduct polymers, cleaning gases can include an oxygen-containing gas, such as $O_2$. Some amount, such as <10%, of a fluorine-containing gas, such as $CF_4$, $SF_6$, or $C_2F_6$, can also be added to clean the polymer in one embodiment. It should be appreciated that nitrogen-containing gas, such as $N_2$, can also be included in the gas mixture. The nitrogen-containing gas assists dissociation of the oxygen-containing gas. An inert gas, such as Ar or He, can also be added to dilute the gas and/or to maintain the plasma. To clean a dielectric film(s), such as SiN or $SiO_2$, at the bevel edge 117, a fluorine-containing gas, such as $CF_4$, $SF_6$, or a combination of both gases, can be used. An inert gas, such as Ar or He, can also be used to dilute the fluorine-containing gas and/or to maintain the cleaning plasma. To clean a metal film(s), such as Al or Cu, at the bevel edge 117, a chlorine-containing gas, such as $Cl_2$, or $BCl_3$, or a combination of both gases, can be used. An inert gas, such as Ar or He, can also be used to dilute the chlorine-containing gas and/or to maintain the plasma to clean the metal film(s).

In one embodiment, the space between the top edge electrode 110 and the bottom edge electrode 120, $D_{EE}$, is less than 1.5 cm to ensure the plasma is confined. A $D_{EE}$ of less than 1.5 cm allows the ratio between the width ($D_W$) and gap ($D_{EE}$) of the opening near substrate edge to be less than 4:1, which ensures plasma confinement. $D_W$ is the width of the opening near the substrate edge. In one embodiment, $D_W$ is the width of the bottom insulating ring 125 or the width of the top insulating ring 115. The chamber pressure is kept between about 100 mTorr to about 2 Torr during the bevel edge cleaning process. The spacing between the gas distribution plate 160 and substrate 150, $D_S$, is less than 0.6 mm to ensure no plasma is formed between the top electrode 160 and the substrate 150 during the bevel edge cleaning process.

In another embodiment, the RF power supply can be coupled to the top edge electrode 110, while the bottom edge electrode 120 is grounded to generate the capacitively coupled cleaning plasma. Alternatively, either the top edge electrode 110 or the bottom edge electrode 120 can be replaced with an inductive coil buried in a dielectric material. In this embodiment, the inductive coil is coupled to a RF power source and the opposing edge electrode is grounded. The RF power source supplies power to generate an inductively coupled etch plasma to clean the bevel edge 117.

The plasma generated near the substrate edge and between the top edge electrode 110 and the bottom edge electrode 120 cleans the substrate bevel edge of the substrate. The cleaning helps reduce the build-up of polymer at the substrate bevel edge, which reduces or eliminates the possibility of particle defects impacting device yield.

Figure 1B:
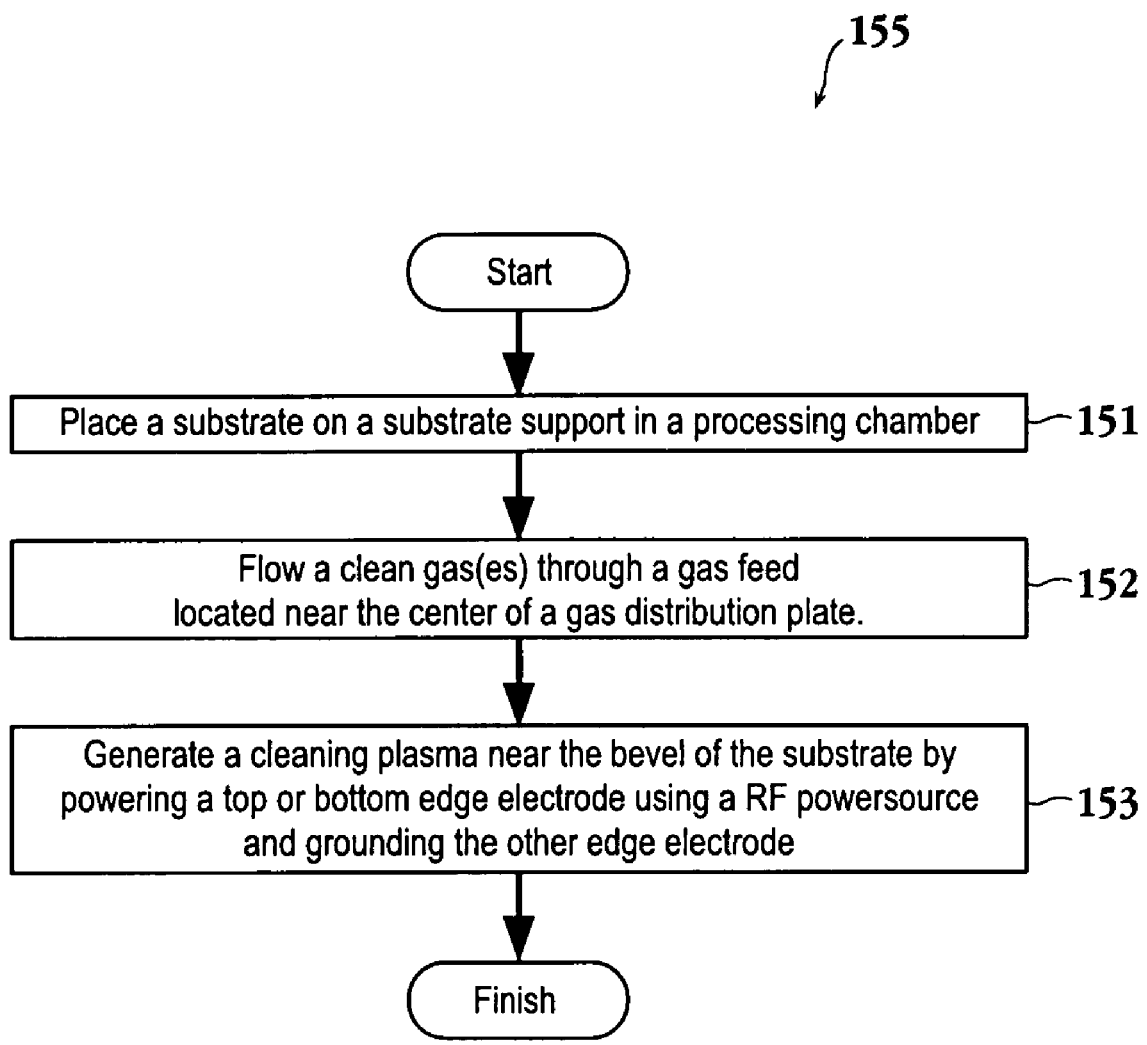
FIG. 1B shows a process flow of using the top and bottom edge electrodes of FIG. 1A to etch byproducts near substrate bevel edge.

FIG. 1B shows an embodiment of a process flow 155 for cleaning the bevel edge of the substrate. The process starts at step 151 by placing a substrate on a substrate support in a processing chamber. The process is followed by flowing a cleaning gas(es) through a gas feed located near the center of the gas distribution plate at step 152. At step 153, a cleaning plasma is then generated near the bevel edge of the substrate by powering either the top or the bottom edge electrode using a RF power source and by grounding the edge electrode that is not powered by the RF source.

Figure 1C:
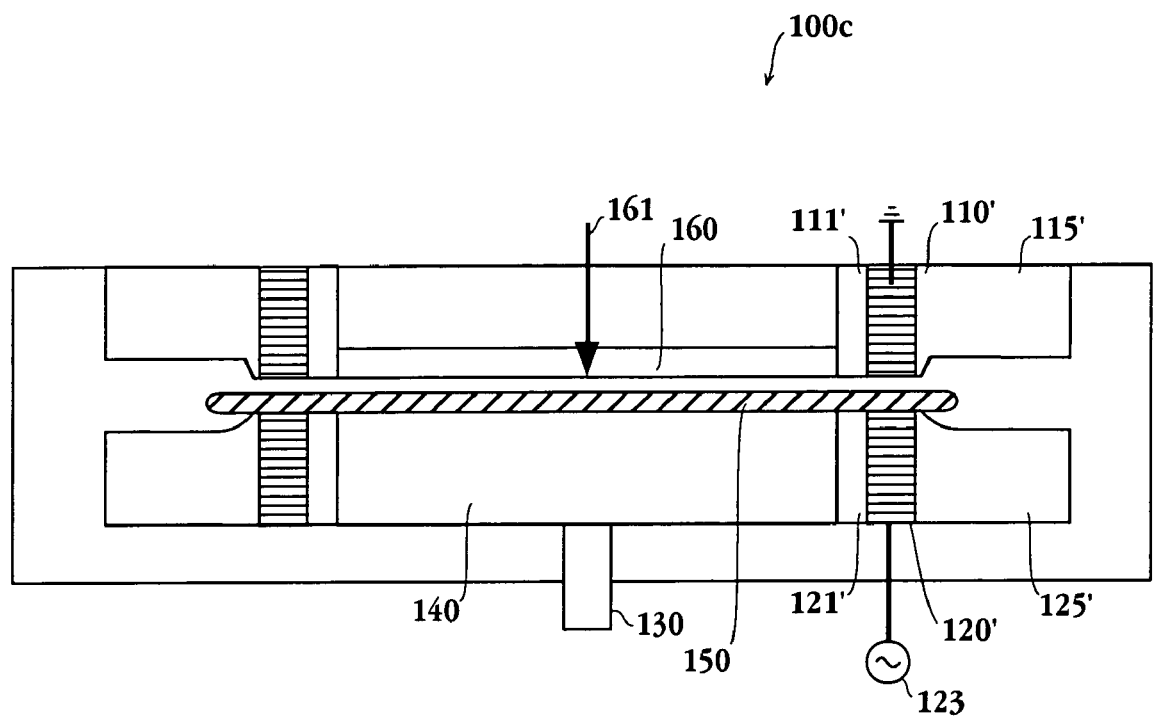
FIG. 1C shows a schematic diagram of another embodiment of a substrate etching system with a pair of top and bottom edge electrodes.

FIG. 1C shows another embodiment of the bevel edge cleaning mechanism. The components in the process chamber 100C of this embodiment is very similar to those shown in FIG. 1A. The different is that, in this embodiment, the bottom edge electrode 120' is moved inward to be in contact with a bottom surface of the substrate 150. The bottom edge electrode 120' is fully under the substrate 150 to ensure that the bottom edge electrode 120' does not get sputtered during cleaning process. The RF power supply 123 supplies a RF power that is transmitted through the substrate 150 to generate a cleaning plasma with the grounded top edge electrode 110. The cleaning plasma cleans the bevel edge. Due to direct RF through the substrate, the substrate has higher DC potential, compared to the embodiment shown in FIG. 1A. The higher DC potential on the substrate results in higher ion energy and a higher etch rate.

Figure 1D:
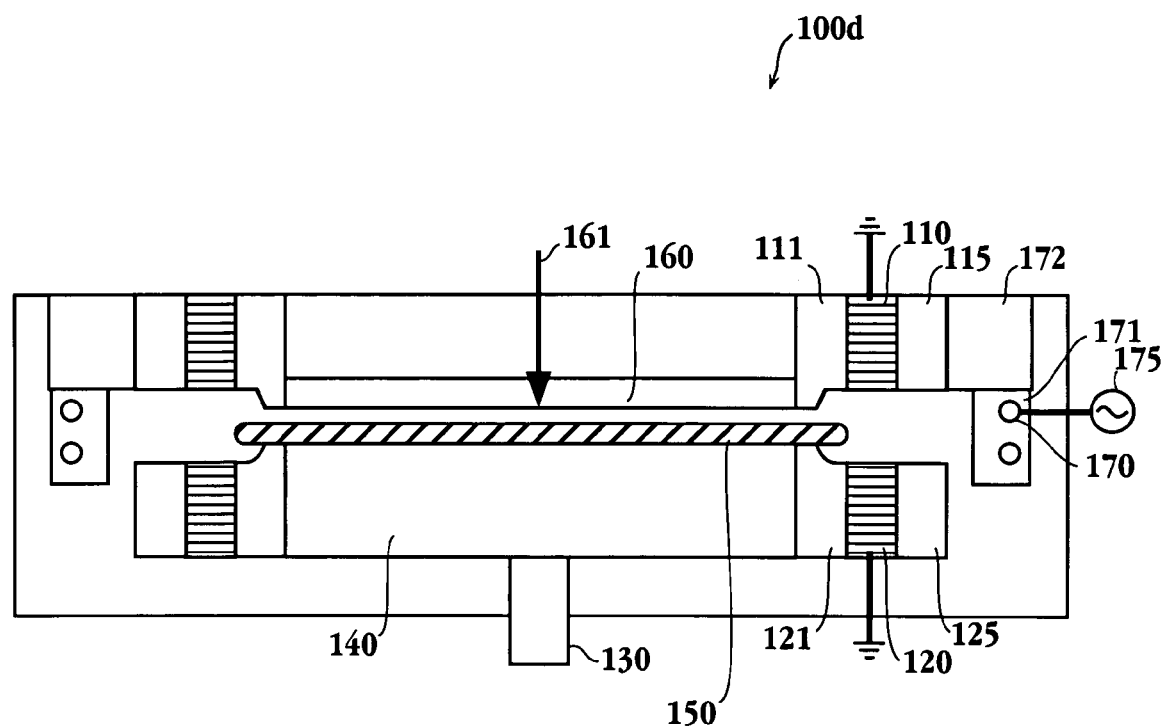
FIG. 1D shows a schematic diagram of an embodiment of a substrate etching system with a pair top and bottom edge electrodes, and surrounding inductive coils.

FIG. 1D shows another embodiment of the bevel edge cleaning apparatus. In this embodiment, the components in the process chamber 100D are similar to those in FIG. 1A. The difference is that an inductive coil(s) 170 surrounds the substrate bevel and the space between the top edge electrode 110 and the bottom edge electrode 120. The inductive coil 170 is embedded in a dielectric material 171 and is coupled to a RF power supply 175. In one embodiment, the dielectric material 171 is coupled to a dielectric support 172.

The inductive coil(s) 170 is coupled to a RF power source 175. During the bevel cleaning process, the RF power source 175 supplies RF power in a range between about 2 MHz to about 13 MHz to generate an inductive plasma near the substrate bevel, in one embodiment. The top edge electrode 110 and the bottom edge electrode 120 are both grounded to provide a returning path for the inductive plasma. The plasma generated can efficiently clean the bevel edge and the substrate backside. Inductive coil 170 can provide a high density plasma to efficiently clean the bevel edge.

The inductive coil 170 shown in FIG. 1D can also be used generate plasma to clean the substrate backside and chamber wall. During substrate backside cleaning, the substrate 150 is raised up to be away from the substrate support 140 by lift pins (not shown). In one embodiment, the pressure in the process chamber is kept below 500 mTorr. The lower chamber pressure allows the cleaning plasma to diffuse under the backside of the substrate. For substrate backside cleaning, the distance requirement between the gas distribution plate 160 and substrate 150, $D_S$, still needs to be kept below 0.6 mm to ensure plasma does not form between the gas distribution plate 160 and the substrate 150. However, the space between the top edge electrode 110 and the bottom edge electrode 120, $D_{EE}$, is no longer needed. Cleaning plasma does not need to be confined between the top edge electrode 110 and bottom edge electrode 120 or between the top insulating ring 115 and bottom insulating ring 125. The cleaning plasma needs to diffuse under raised substrate 150 to clean the substrate backside. It should be appreciated that configurations and processes similar to the ones used to clean the substrate backside can also be used to clean the etch byproducts accumulated in the chamber interior, including the chamber walls. During chamber interior cleaning, the substrate can stay in the chamber or can be removed from the chamber. In one embodiment, substrate backside cleaning and chamber interior cleaning can occur simultaneously.

Figure 1E:
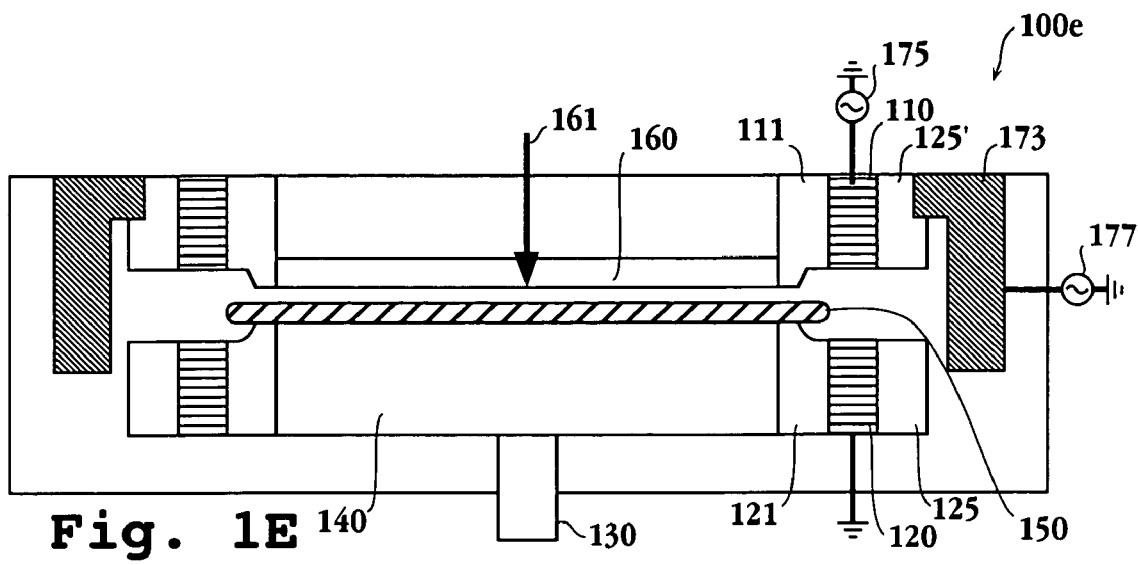
FIG. 1E shows a schematic diagram of an embodiment of a substrate etching system with a pair of top and bottom edge electrodes, and an overhang electrode surrounding the pair of edge electrodes.

As described above, capacitively coupled plasma can also be used to clean bevel edge and to clean substrate backside. To clean the bevel edge, the frequency of RF power used is be between about 2 MHz to about 13 MHz. To clean the chamber edge, the frequency of RF power is between about 27 MHz to about 60 MHz. FIG. 1E shows another embodiment that allows cleaning the bevel edge, substrate backside and chamber interior using dual RF frequencies. In this embodiment, a conductive overhang 173 is placed surrounding the opening between the top edge electrode 110 and the bottom edge electrode 120. In one embodiment, the conductive overhang 173 is coupled to a high-frequency RF power source 177, the top edge electrode 110 is coupled to a low-frequency RF power source 175, and the bottom edge electrode 120 is grounded. The high-frequency RF power has a frequency between about 27 MHz to about 60 MHz. The low-frequency RF power has a frequency between about 2 MHz to about 13 MHz. During substrate backside and chamber interior cleaning, the high-frequency RF power source 177 supplies the RF power to generate cleaning plasma. The top electrode 110 is grounded. In one embodiment, the chamber pressure is kept below 500 mTorr. The substrate is raised above the substrate support by the lift pins (not shown). The spacing requirement between the top edge electrode and the bottom edge electrode of <1.5 cm is no longer needed. Cleaning plasma needs to diffuse under substrate backside and diffuse to other parts of the chamber interior for cleaning. However, the spacing requirement between the gas distribution plate 160 and the substrate 150 of <0.6 mm is still needed to ensure plasma does not form between the gas distribution plate 160 and the substrate 150. The relatively low chamber pressure of less than 500 mTorr allows the process plasma to diffuse beneath the substrate and the chamber cleaning plasma can clean the entire chamber.

During the bevel edge cleaning, the low-frequency RF power source 175 supplies the RF power to generate cleaning plasma. The conductive overhang is grounded. In one embodiment, the chamber pressure is kept between about 100 mTorr to about 2 Torr. The spacing requirement between the top edge electrode and the bottom edge electrode of <1.5 cm and the spacing requirement between the gas distribution plate 160 and the substrate 150 of <0.6 mm needs to be complied within this embodiment to ensure the plasma is confined and is not formed between the gas distribution plate 160 and the substrate 150.

Figure 1F:
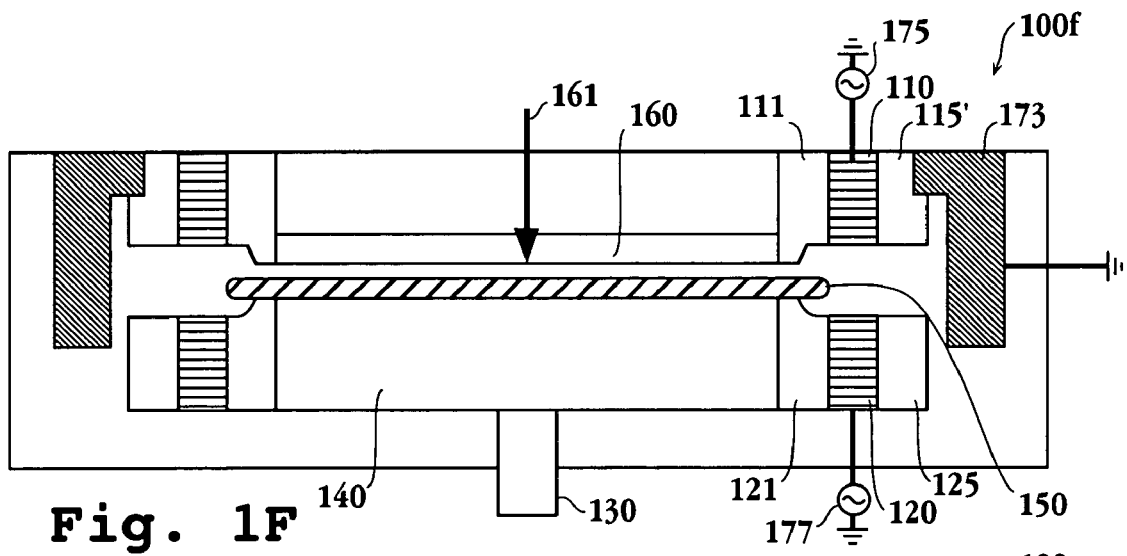
FIG. 1F shows a schematic diagram of another embodiment of a substrate etching system with a pair of top and bottom edge electrodes, and an overhang electrode surrounding the pair of edge electrodes.

In another embodiment (shown in FIG. 1F), the top edge electrode 110 is coupled to a low-frequency RF power supply 175 and the bottom edge electrode 120 is coupled to a high-frequency RF power supply 177. The conductive overhang 173 is grounded. The process conditions and configurations are similar to those discussed in the embodiment of FIG. 1E. Alternatively, the top edge electrode 110 can be coupled to a high-frequency RF, between about 27 MHz to about 60 MHz, power supply 177 and the bottom edge electrode 120 can be coupled to a low-frequency RF, between about 2 MHz to about 13 MHz, power supply.

Figure 1G:
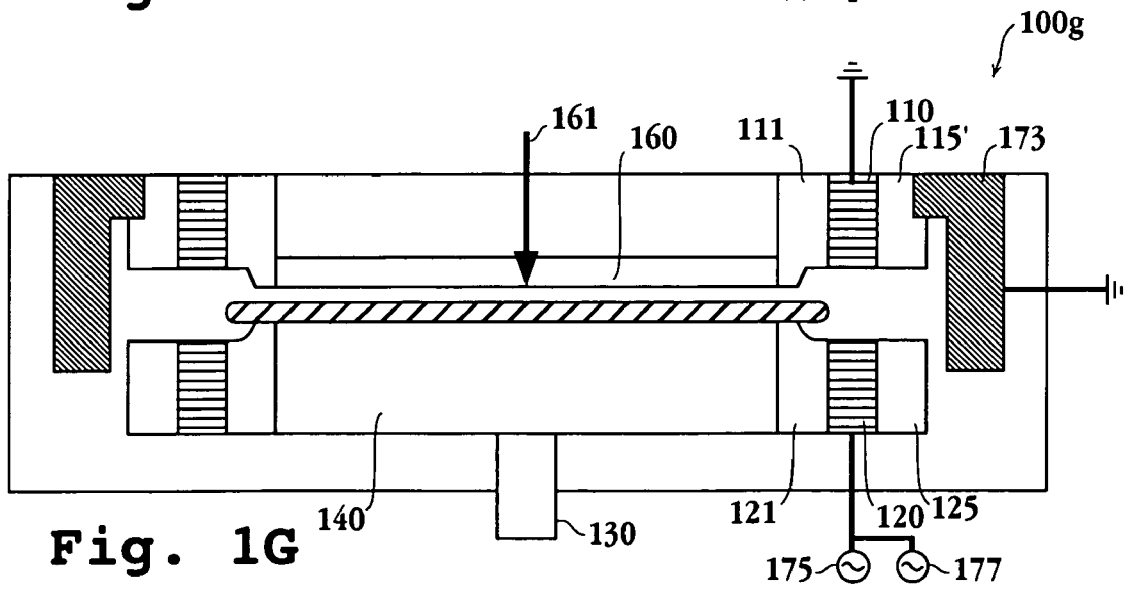
FIG. 1G shows a schematic diagram of yet another embodiment of a substrate etching system with a pair of top and bottom edge electrodes, and an overhang electrode surrounding the pair of edge electrodes.

In yet another embodiment (shown in FIG. 1G), both the top edge electrode 110 and the conductive overhang 173 are grounded. The bottom edge electrode 120 is coupled to two RF power supplies 175, 177 that can supply two types of RF power, one between about 2 MHz and about 13 MHz and the other between about 27 MHz and about 60 MHz. During bevel cleaning, the RF supply that supplies between about 2 MHz to about 13 MHz is turned on. During substrate backside cleaning, the RF power supply that supplies power between about 27 MHz and about 60 MHz is turned on. Alternatively, the top edge electrode 110 can be coupled to two RF power supplies 175 and 177, while the bottom edge electrode 120 and the conductive overhang 173 are grounded.

Figure 1H:
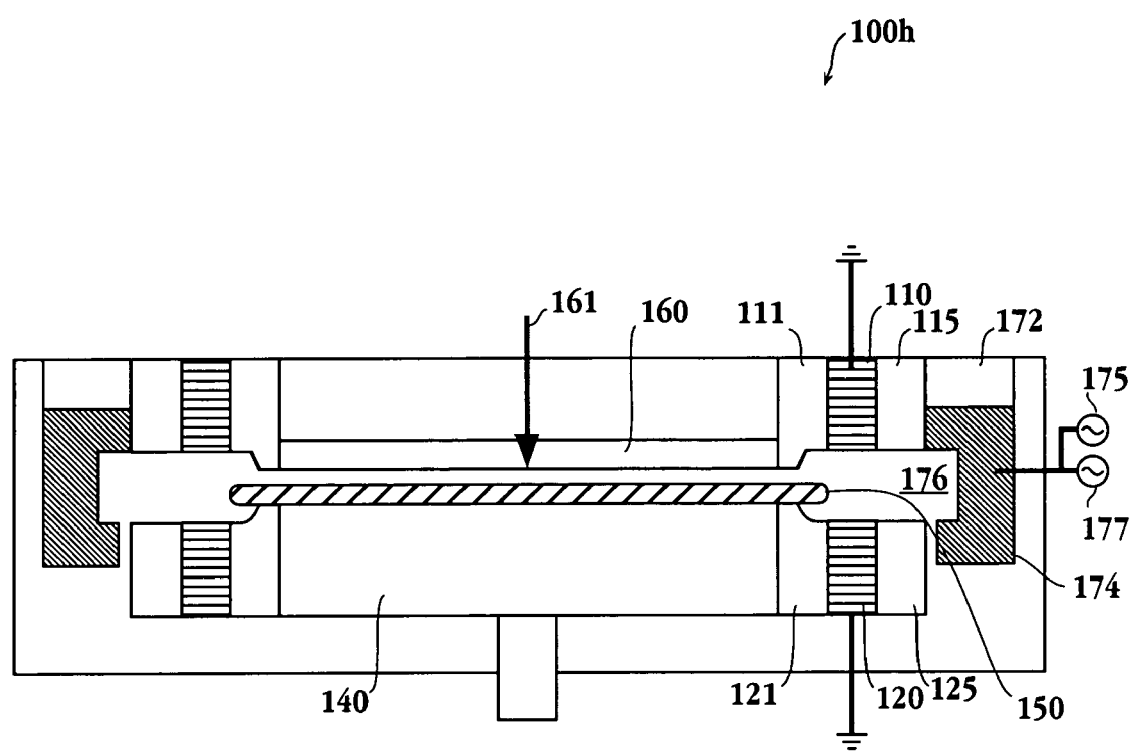
FIG. 1H shows a schematic diagram of an embodiment of a substrate etching system with a pair of top and bottom edge electrodes, and a hollow cathode electrode surrounding the pair of edge electrodes.

In another embodiment as shown in FIG. 1H. Outside the dielectric rings 115 and 125 that surround the top edge electrode 110 and the bottom edge electrode 120 respectively, there is a hollow cathode ring 174, which is made of a conductive material, such as aluminum (Al). The hollow cathode ring 174 has an opening 176 that faces the bevel edge. In one embodiment, the width of the opening 176 is greater than about 1.0 cm. The hollow cathode ring is coupled to an RF power source 175 and both the top edge electrode 110 and the bottom edge electrode 120 are grounded. The gas distribution plate 160 and substrate support 140 are kept floating in this embodiment. In one embodiment, the hollow cathode ring 174 is powered by the RF power supply 175 to generate a plasma processing gas to clean the bevel edge. RF power supply 175 supplies between about 2 MHz to about 13 MHz. In another embodiment, the hollow cathode ring 174 is powered by the RF power supply 177 to generate a plasma processing gas to clean the substrate backside and/or chamber interior. RF power supply 177 supplies power between about 27 MHz and about 60 MHz. In one embodiment, the process gas is supplied through a gas feed 161 near the substrate center. Hollow cathode ring 174 generates a high-density plasma, for example in the range between about 1E10 to about 1E11, that is very efficient in cleaning the bevel edge. For this embodiment, the spacing requirement between the top edge electrode 110 and bottom edge electrode 120, $D_{EE}$, of less than 1.5 cm is no longer needed. However, the requirement between the gas distribution plate 160 and the substrate 150 is still needed to ensure no plasma is formed between the top distribution plate 160 and the substrate 150.

Figure 2A:
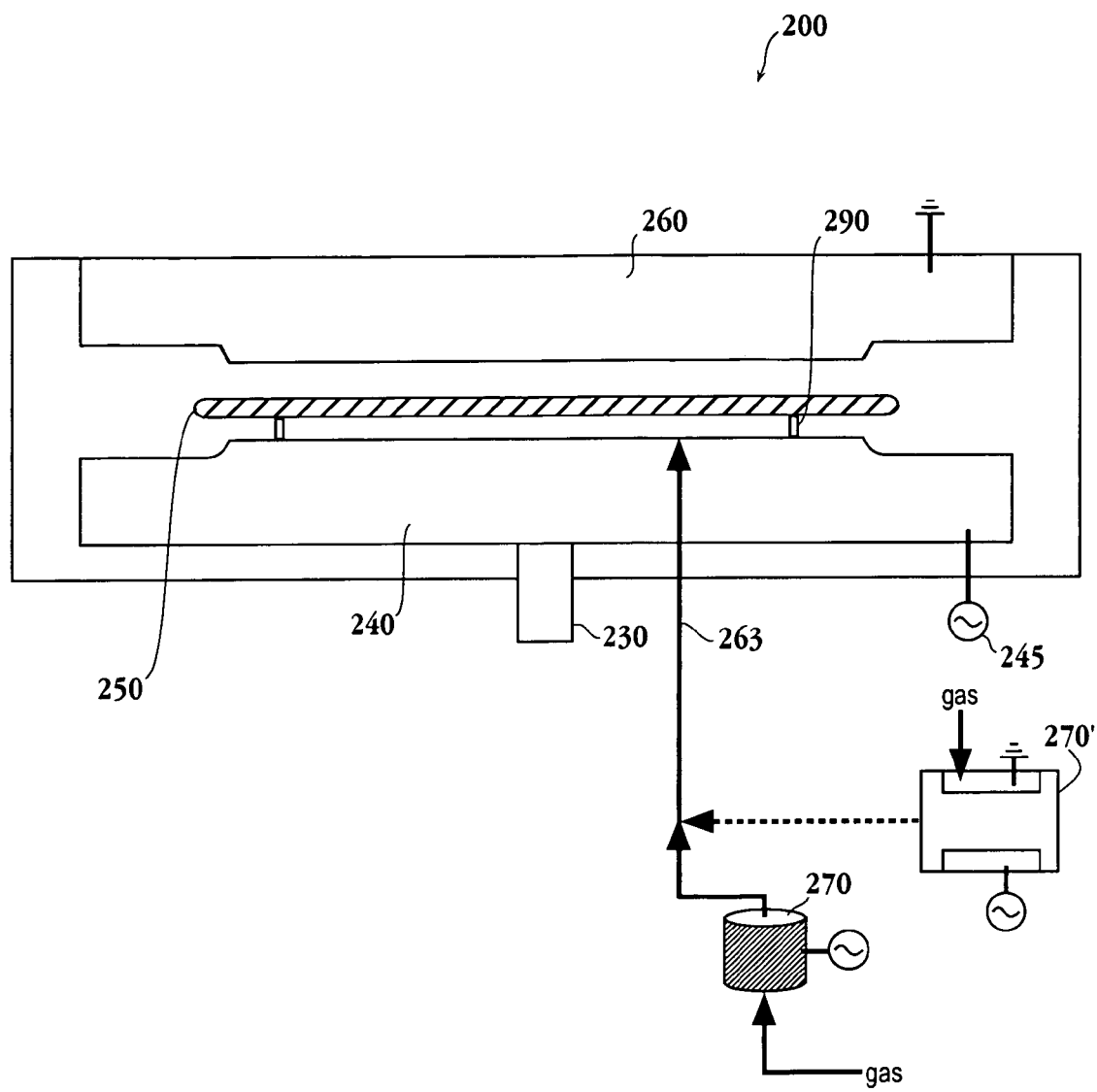
FIG. 2A shows a substrate etching system with a remote plasma cleaning source coupled to the substrate support.

FIG. 2A shows another embodiment of the present invention. In this embodiment, a process chamber 200 has a top gas distribution plate 260 and a substrate support 240. In one embodiment, the gas distribution plate 260 can also be an electrode and the substrate support can be an electrostatic chuck that is coupled to a RF power supply 245. In another embodiment, the substrate support 240 is coupled to a moving assembly 230 that can move the substrate support up and down. During etching of substrate 250, the RF power supply 245 provides RF power to generate a capacitively coupled etch plasma with the grounded top electrode 260 to etch substrate 250. This etch configuration is merely used as an example. Other etch configurations to generate capacitively or inductively plasma to etch substrate 250 can also be used.

A gas feed 263 is embedded in the substrate support 240 to supply a remotely generated cleaning plasma to the backside of the substrate 250 to clean substrate backside or to the chamber 200 to clean the process chamber 200. During substrate backside cleaning, lift pins 290 raise the substrate 250 to separate from the substrate support 240. A remote cleaning plasma source 270 or 270' provides a cleaning plasma to the backside of the substrate 250 to clean the substrate backside. In one embodiment, the remote cleaning plasma is generated by a microwave, which is illustrated as a microwave source 270 in FIG. 2A. In another embodiment, the remote cleaning plasma is generated by a pair of capacitively coupled electrodes as a capacitively coupled plasma (CCP), which is illustrated as a CCP source 270' in FIG. 2A. Other types configurations, such as inductively coupled plasma generator, can also be used to generate remote plasma. As described earlier, during substrate backside, the chamber pressure is kept below 500 mTorr to allow cleaning plasma to diffuse (or spread) under the substrate 250.

The remote plasma supplied through a gas feed 263 embedded in the substrate support 240 can also be used to clean the chamber interior, including chamber walls 201. During cleaning of the chamber interior, substrate 250 can rest on the lift pins 290 or be removed from the substrate chamber 200. During chamber interior cleaning, the chamber pressure is kept below 5 Torr.

Figure 2B:
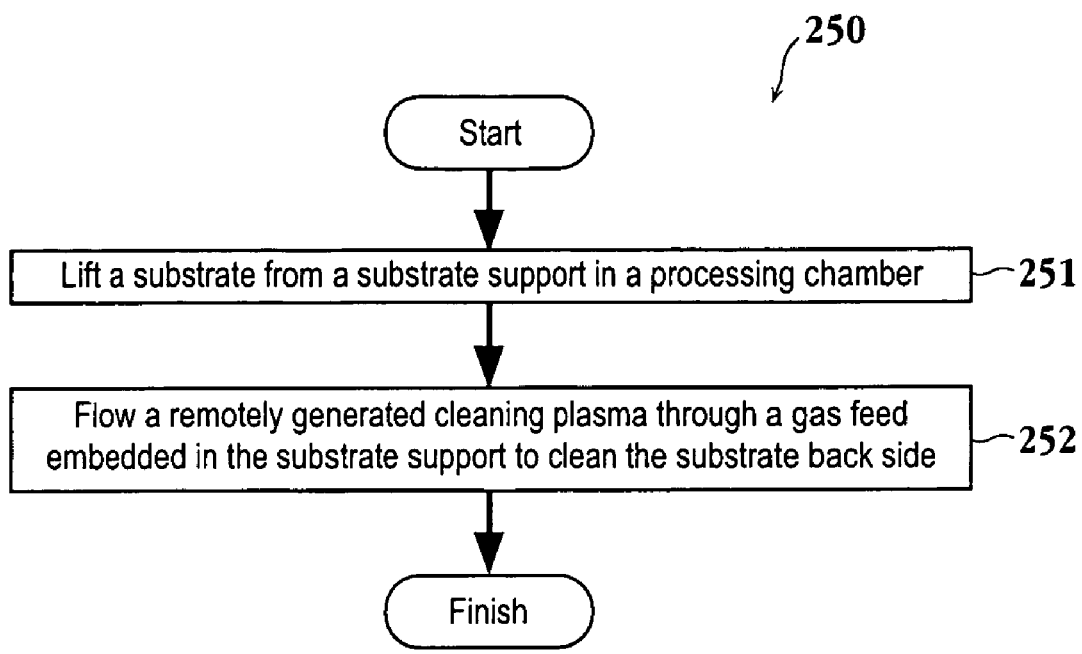
FIG. 2B shows a process flow to clean substrate backside.
Figure 2C:
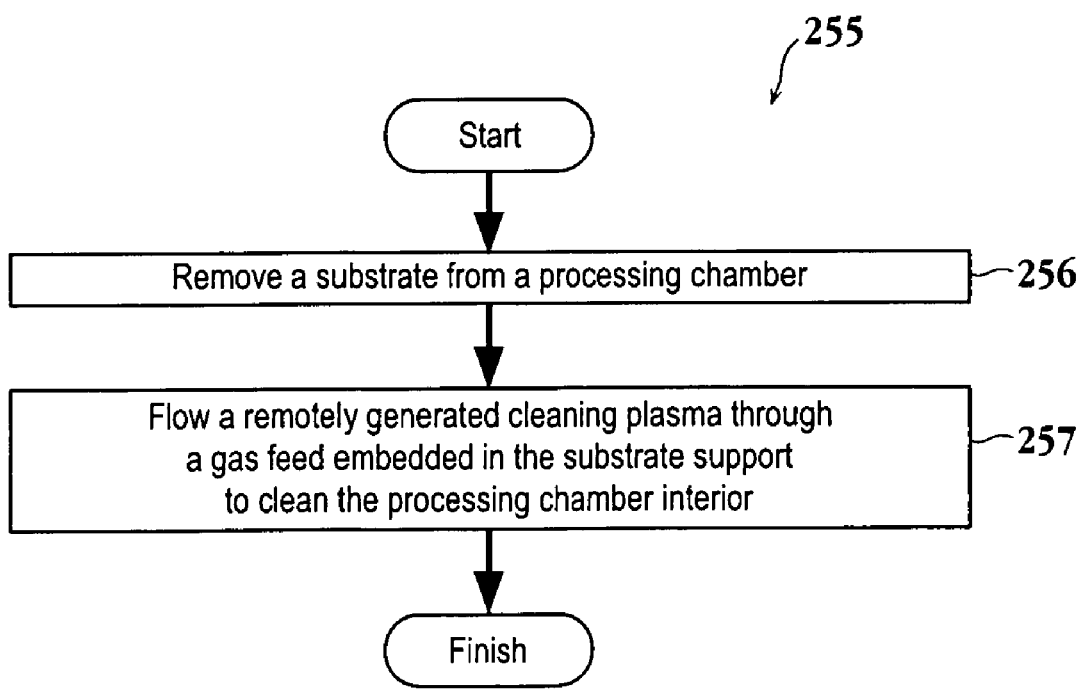
FIG. 2C shows a process flow to clean chamber interior.

FIG. 2B shows an embodiment of a process flow 250 for cleaning the substrate backside. At step 251, a substrate is raised from a substrate support in a processing chamber. At step 252, a remotely generated cleaning plasma is flown through a gas feed embedded in the substrate support to clean the substrate backside. FIG. 2C shows an embodiment of a process flow 255 for cleaning the process chamber. At step 256, a substrate is removed from a substrate processing chamber. The processing chamber can be a deposition chamber, an etch chamber, or other types of chambers that can benefit from such a concept. At step 257, a remotely generated cleaning plasma is flown through a gas feed embedded in the substrate support to clean the processing chamber interior.

Figure 3A:
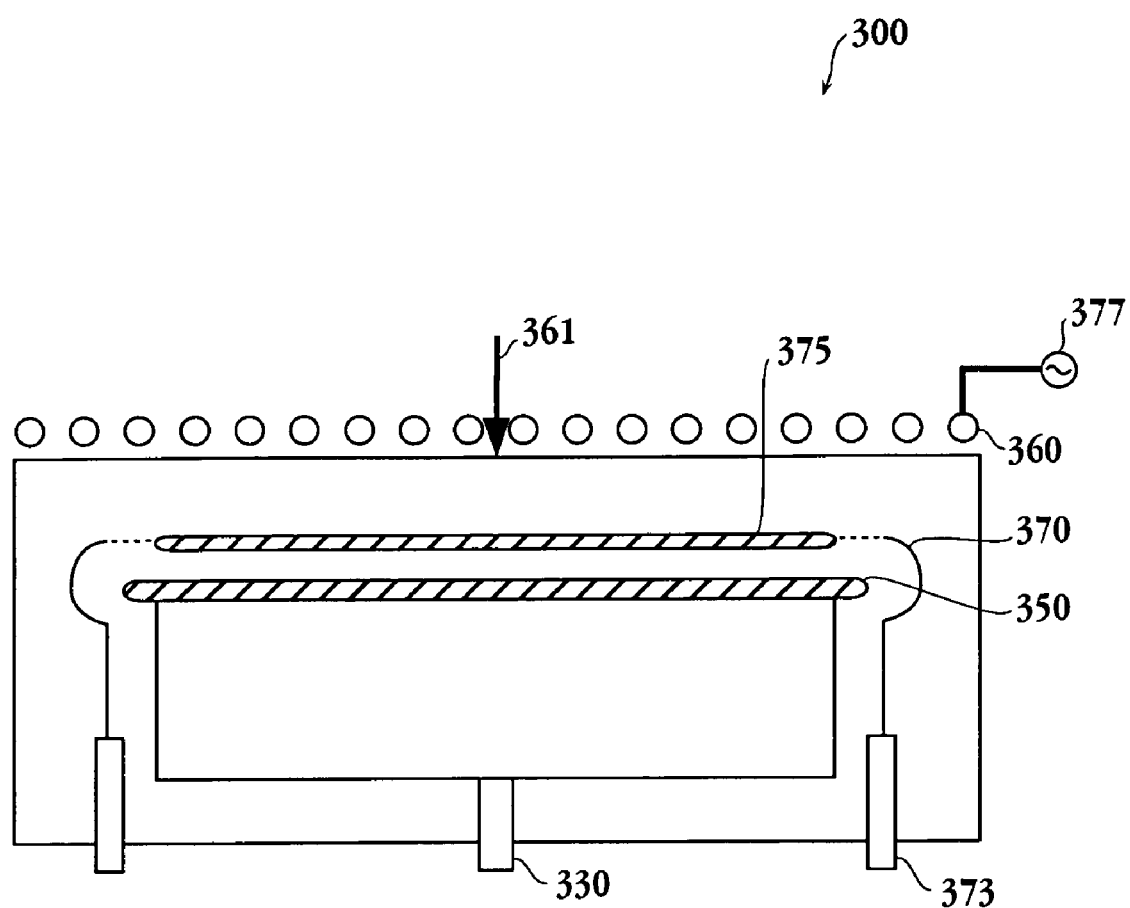
FIG. 3A shows a schematic diagram of an embodiment of a substrate etching system with a substrate cover plate.

FIG. 3A shows an embodiment of a mechanism to clean the substrate bevel edge. In this embodiment, a cover plate 375 is placed over a substrate 350 during bevel cleaning. In one embodiment, the distance between the substrate surface and the surface of the cover plate 375 that faces the substrate 350 is less than about 0.5 mm. The cover plate 375 is made of dielectric materials, such as quartz or ceramic. The cover plate is supported by a support assembly 370, which can be moved up and down by a mechanical mechanism 373. The cover plate support assembly 370 can be made of dielectric materials or has a dielectric coating. Examples of dielectric materials include quartz and ceramic. During substrate etching, cover plate 375 is removed from the substrate surface. The cover plate support 370 is moved to be at the same height as the substrate 350 or below the substrate 350 during etching process. During bevel edge cleaning, a capacitively coupled plasma or inductively coupled plasma can be generated to clean the substrate bevel edge. In the embodiment shown in FIG. 3A, an inductive coil(s) 360 is placed outside chamber 300. The inductive coil(s) 360 is coupled to a RF power source 377. The substrate support 340 is grounded to provide a return path for the inductive plasma. The process gas can be supplied at the top of the process chamber through a gas feed 361, or by other gas feed configurations.

Figure 3B:
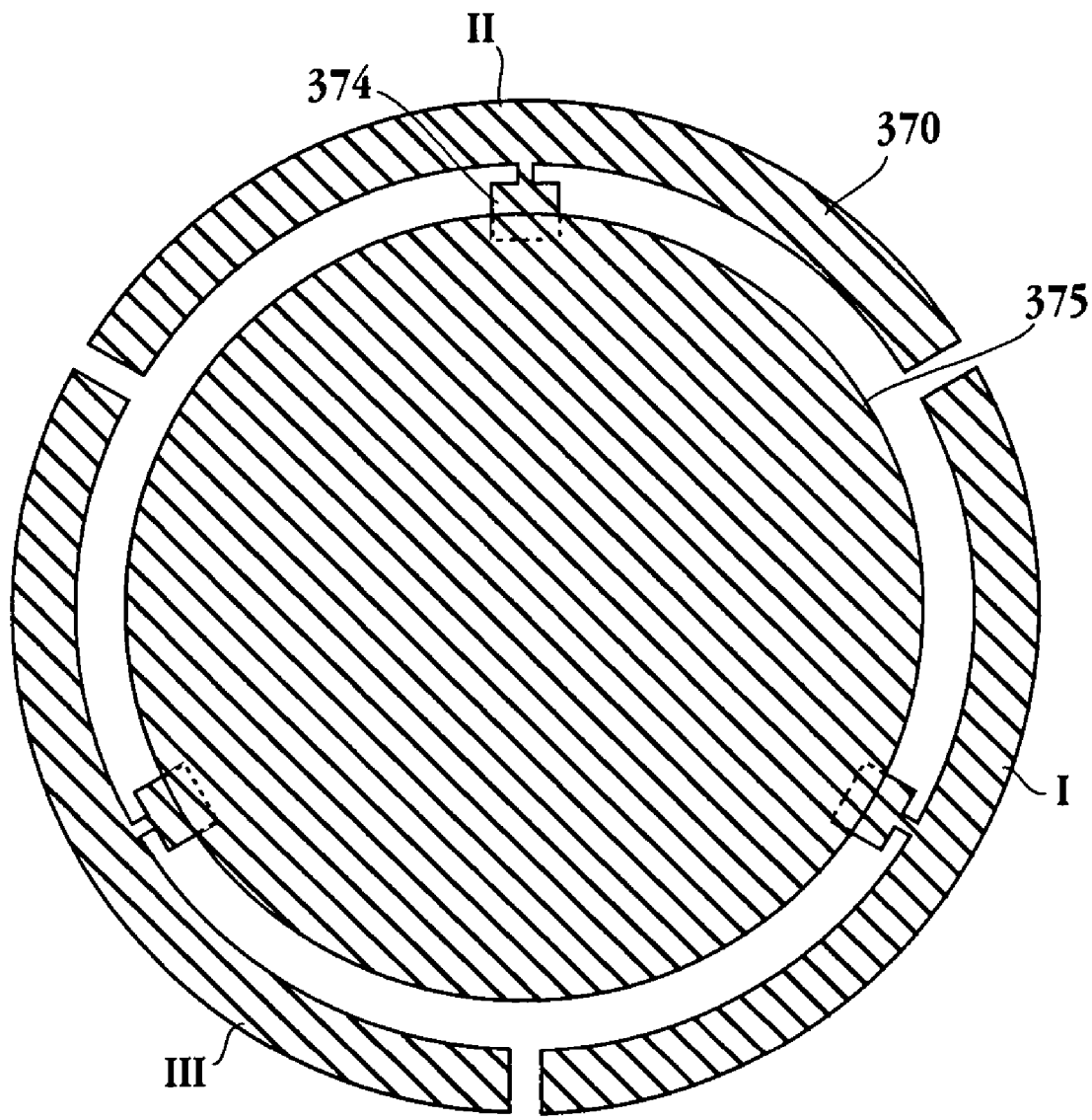
FIG. 3B shows a top schematic diagram of an embodiment of a substrate cover plate with a substrate cover support.

The inductive plasma can clean the substrate bevel edge, while the cover plate protects the main substrate surface. FIG. 3B shows the top view of the cover plate 375 and the cover plate support assembly 370. The cover plate support assembly 370 has multiple support fingers 374 that are used to support the cover plate. In one embodiment, the cover plate support assembly 370 is made of multiple pieces, I, II, and III, that allow the cover plate support 370 to move below the substrate 350 during etching process.

Figure 3C:
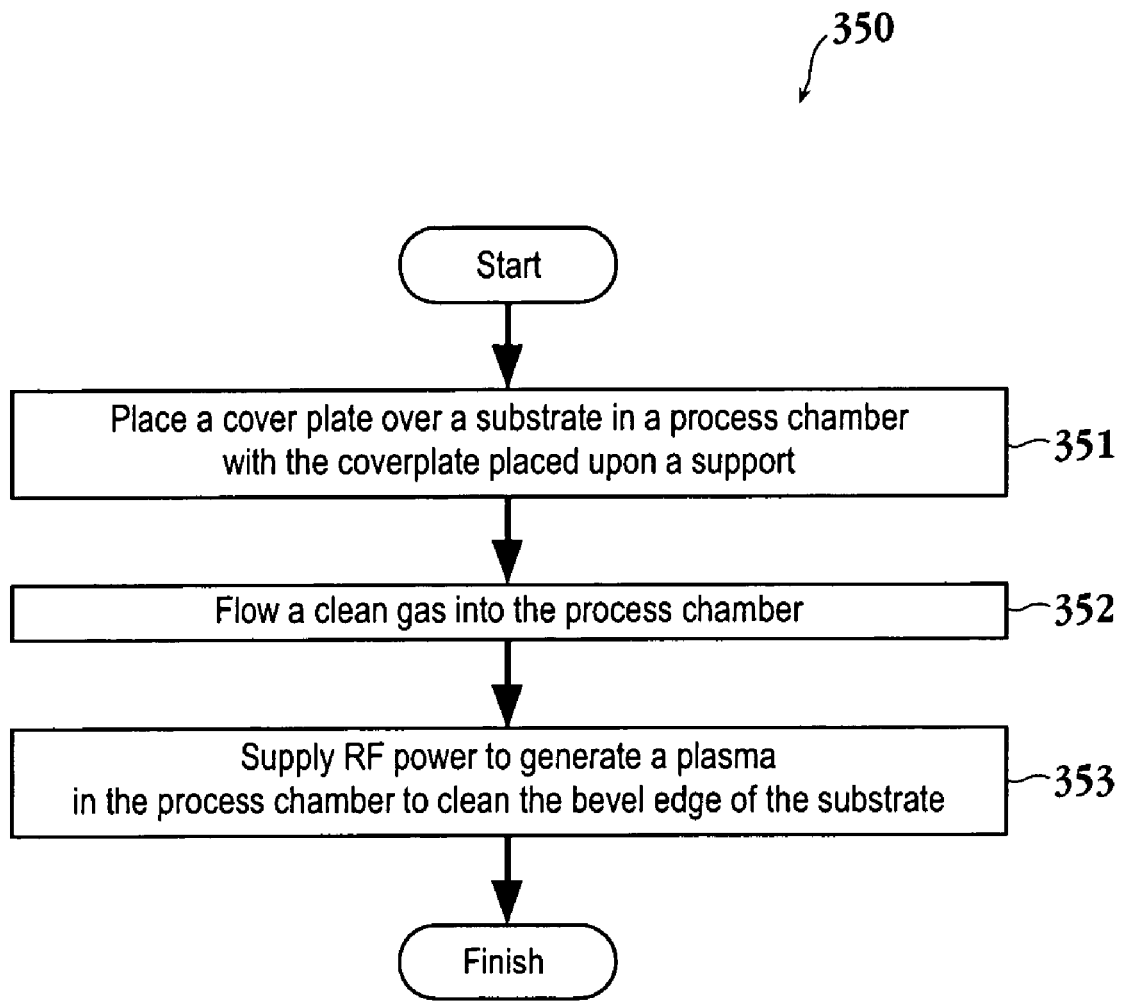
FIG. 3C shows a process flow to clean substrate bevel edge in a substrate etching system with a substrate cover plate.

FIG. 3C shows a bevel edge cleaning process flow 350. The process starts at step 351 by placing a cover plate cover a substrate that sits on a substrate support. The cover plate is placed upon a cover plate support. The cover plate covers the center of the substrate and leaves the substrate bevel edge (or the area between the edge of the cover plate 375 and the edge cover plate support assembly 375) exposed. At step 352, a cleaning gas(es) is flown into the process chamber. At step 353, a RF power is supplied to the electrode to generate a cleaning plasma to clean bevel edge of the substrate.

The embodiments described above provide improved apparatus and methods for cleaning bevel edge, substrate backside and chamber interior. The embodiments and concepts described above to clean bevel edge, substrate backside and chamber interior can be applied to dielectric etch chambers or conductor etch chambers, which include metal etch chamber. The embodiments and concepts described above also can be applied to other types of etch chambers, applicable deposition chambers, and applicable processing chambers.

The improved apparatus and methods for cleaning of bevel edge, substrate backside, and chamber interior reduce undesirable build-up of etch by-products and deposited films on the substrate or chamber interior and enhance the device yields.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A plasma etch processing chamber configured to clean a bevel edge of a substrate, the plasma etch processing chamber comprising:
a bottom edge electrode surrounding a substrate support in the plasma processing chamber, having at least a portion of a top surface at the same lever as a top surface of the substrate support, wherein the substrate support is configured to receive the substrate;
a bottom dielectric ring disposed between the bottom edge electrode and the substrate support, the bottom dielectric ring surrounding the substrate support, the bottom dielectric ring electrically separating the substrate support and the bottom edge electrode;
a gas distribution plate opposing the substrate support, the gas distribution plate including at least a gas feed for supplying a gas;
a top dielectric ring surrounding the gas distribution plate;
a top edge electrode surrounding the gas distribution plate opposing the substrate support, wherein the top dielectric ring is disposed between the top edge electrode and the gas distribution plate, and the top edge electrode and the gas distribution plate are electrically isolated from each other by the top dielectric ring; and
a bottom insulating ring surrounding and coupled to the bottom edge electrode, wherein the bottom edge electrode is disposed between the bottom insulating ring and the bottom dielectric ring, and wherein an inner portion of the bottom insulating ring is taller than an outer portion of the bottom insulating ring, the inner portion of the bottom insulating ring being disposed closer to the bottom edge electrode than the outer portion of the bottom insulating ring.

2. The plasma etch processing chamber of claim 1, further comprising:
a top insulating ring surrounding and coupled to the top edge electrode, wherein a bottom surface of the top insulating ring is disposed higher than a bottom surface of the top edge electrode, for diffusing the cleaning plasma, and wherein an inner portion of the top insulating ring is taller than an outer portion of the top insulating ring, the inner portion of the top insulating ring being disposed closer to the top edge electrode than the outer portion of the top insulating ring.

3. The plasma etch processing chamber of claim 2, wherein the top insulating ring and the bottom insulating ring confine the cleaning plasma generated by the top edge electrode and the bottom edge electrode.

4. The plasma etch processing chamber of claim 1, wherein a surface of the bottom insulating ring configured to face the substrate is lower than a surface of the bottom edge electrode configured to contact the substrate, for diffusing the cleaning plasma.

5. The plasma etch processing chamber of claim 1 further comprising an RF power source disposed below the bottom edge electrode and supplying power through the bottom edge electrode, wherein the bottom edge electrode is coupled to the RF power source to supply the power to generate the cleaning plasma, and the top edge electrode is grounded.

6. The plasma etch processing chamber of claim 1, wherein the substrate support is powered by a radio frequency power source.

7. The plasma etch processing chamber of claim 1, wherein the distance between the gas distribution plate and the surface of the substrate facing the distribution plate is less than the distance between the top edge electrode and the bottom edge electrode, for preventing plasma from being formed between the gas distribution plate and the substrate.

8. The plasma etch processing chamber of claim 1, wherein the bottom insulating ring is configured to contact the substrate.

9. The plasma etch processing chamber of claim 1, wherein the bottom edge electrode contacts the substrate.

* * * * *